(12) United States Patent
Sugimura

(10) Patent No.: US 7,362,160 B2
(45) Date of Patent: Apr. 22, 2008

(54) FUSE TRIMMING CIRCUIT

(75) Inventor: Naoaki Sugimura, Tokyo (JP)

(73) Assignee: OKI Electric Industry Co., Ltd., Tokyo (JP)

( * ) Notice: Subject to any disclaimer, the term of this patent is extended or adjusted under 35 U.S.C. 154(b) by 36 days.

(21) Appl. No.: 11/521,463

(22) Filed: Sep. 15, 2006

(65) Prior Publication Data

US 2007/0064508 A1    Mar. 22, 2007

(30) Foreign Application Priority Data

Sep. 21, 2005   (JP) ............................. 2005-274368

(51) Int. Cl.
*H01H 37/76*   (2006.01)
(52) U.S. Cl. ..................................... 327/525
(58) Field of Classification Search .............. 327/524, 327/525, 526
See application file for complete search history.

(56) References Cited

U.S. PATENT DOCUMENTS

| 4,532,607 | A  | 7/1985 | Uchida |
| 5,731,733 | A  | 3/1998 | Denham |
| 6,205,077 | B1 | 3/2001 | Ferrant .................... 365/225.7 |
| 6,288,598 | B1 | 9/2001 | Huang et al. ................ 327/525 |

OTHER PUBLICATIONS

Japan Institute of Invention and Innovation Journal of Technical Disclosure No. 2001-6215, Dec. 3, 2001; English translation.

*Primary Examiner*—Jeffrey Zweizig
(74) *Attorney, Agent, or Firm*—Donald R. Studebaker; Nixon Peabody LLP

(57) ABSTRACT

The present invention provides a fuse trimming circuit that can reduce power consumption and improve operation reliability. The fuse trimming circuit is provided with a fuse-state determining circuit, which determines whether a fuse element is in an unblown state or in a blown state by comparing drain currents flowing to transistors, and a latch circuit which latch trimming information representing the state of the fuse element. After the determining operation, a bias circuit generating a bias voltage applied to the transistors. Drain currents do not flow to the transistors, so that a state of the fuse element is precisely determined even if the fuse device is in an incomplete blown state.

7 Claims, 8 Drawing Sheets

FUSE TRIMMING CIRCUIT

BACKGROUND OF THE INVENTION

1. Field of the Invention

The present invention relates to a fuse trimming circuit having a fuse element formed on a semiconductor substrate in an integrated circuit.

2. Description of the Related Art

A conventional fuse trimming circuit using a fuse element formed on a semiconductor substrate is disclosed by such patent documents as U.S. Pat. No. 4,532,607 (D1), U.S. Pat. No. 5,731,733 (D2), and Hatsumei Kyokai Kokai Giho, No. 2001-6215 (D3).

FIG. 1 is a circuit diagram showing a conventional fuse trimming circuit disclosed by the document D1. The fuse trimming circuit is provided with P channel MOS transistors (PMOS's) 1a, 1b, a resistance detection part 1 having a resistive element 1c and a fuse element 1d, a PMOS 2a, a PMOS 2b, and an amplifier 2 having N channel MOS transistors (NMOS's) 2c, 2d, 2e, and 2f.

In the resistance detection part 1, a voltage difference corresponding to a resistance difference between the resistive element 1c and the fuse element 1d appears across nodes Na and Nb. The voltage difference across the nodes Na and Nb is amplified in the amplifier 2 and then generated from a node Nd. When the fuse element 1d is cut or blown, a resistance of the resistive element 1c (R1c) becomes smaller than that of the fuse element 1d (R1d) and thus a voltage at a node Na (VNa) becomes smaller than that at a node Nb (VNb), so that a supplied voltage at the Nd decreases through the amplifier 2. Therefore, a low level signal having a low(L) level is generated from an output terminal ZOUT.

When the fuse element 1d is kept on un-blown and the R1c is made larger than the R1d and thus the VNa is larger than the VNb, so that, a high level signal having a high (H) level is generated from the output terminal ZOUT. Even when the fuse element 1d is not completely disconnected or blown state, the circuit can be controlled by fuse information representing a blown state or an un-blown state of the fuse element generated from the output terminal ZOUT as long as the R1c is smaller than the R1d. The fuse information representing a blown state or an un-blown state of the fuse element is used for operating the circuit by activating the amplifier 2 with the signal "Enable" when an IC is switched on. The semiconductor integrated circuit, therefore, prevents from malfunctioning even when the fuse element is not completely disconnected due to the incomplete disconnection.

The documents D1 and D2 respectively disclose fuse trimming circuit, each describing such a technique that detects a blown state or an un-blown state of a fuse element by comparing currents flowing through the fuse element and a resistive element which are connected in parallel with each other and latches the determination result.

However, the conventional fuse trimming circuits disclosed by the documents D1 to D3 encounter the following problems:

In the circuit shown in FIG. 1, the circuit normally operates as long as the resistance of R1c is smaller than the resistance of R1d even when the fuse element 1d is in an incomplete brown state. The PMOS 1b and the fuse element Id are connected in series to each other between a power supply (VDD) node and a ground (GND) node, so that a current continues to flow through the fuse element 1d through the PMOS 1d in an un-blown. When the current continues to flow through the fuse element 1d in an incomplete blown state, the fuse element gradually connects again, thus causing a risk that a resistance R1d of fuse element 1d gradually decreases. A problem relating to reliability of a circuit arises that malfunction occurs in a circuit that operates normally if the circuit is used for a long time period The conventional fuse trimming circuits are not suitable for low-power consumption type large-scale integration (LSI) circuit because a stationary current keeps flowing through the resistive element 1c and the fuse element 1d in the incomplete blown state even if the enable signal "Enable" is changed to the level "L" and the NMOS 2e is switched off.

SUMMARY OF THE INVENTION

An object of the present invention is to provide a fuse trimming circuit that can operate without malfunction even in an incompletely disconnected or blown state of the fuse element.

According to a first aspect of the present invention, there is provided a fuse trimming circuit having a controlling circuit, a bias circuit, a fuse-state determining circuit, and a latch circuit.

The controlling circuit generates a first pulse which is generated by delaying an input pulse, a second pulse which is generated by delaying said first pulse, and a third pulse having a pulse width from a leading edge of said first pulse to a trailing edge which is generated by a trailing edge of said second pulse. The bias circuit connected across a first power supply node and a second power supply node generates a bias voltage during a time period of said pulse width in response to said third pulse.

The fuse-state determining circuit has a first transistor, a first output node, a second transistor, and a resistive element which are connected in series between said first power supply node and said second power supply node, and a third transistor, a second output node, a forth transistor, and a fuse element which are connected in series between said first power supply node and said second supply node. And, said first and third transistors turn on in response to said first pulse, said second and said fourth transistors turn on in response to said bias voltage, and a resistance of said resistive element is larger than that of said fuse element in an un-blown state and smaller than that of said fuse element in a blown state.

The latch circuit connected across the said first power supply node and said second power supply nodes, for amplifying a voltage difference across said first and said second nodes holds said voltage difference as trimming information which represents a blown state or an un-blown state of said fuse element.

According to the first aspect of the present invention, either a blown or an un-blown state of the fuse element 35-2 is determined by comparing drain currents of the second and the fourth transistors which are determined from resistances of the resistive element and the fuse element, so that a blown state or an un-blown state of the fuse element can be adequately determined if a resistance of the resistive element is smaller than that of the fuse element in a blown state even when the fuse element is not completely blown. After the determining operation, the bias circuit generating the bias voltage is turned off, and the second and the third transistors are off-states, thus a current flows to the fuse element in incomplete blown state only when a blown state or an un-blown state of the fuse element is determined. Therefore, a problem that the fuse element in a blown state is gradually conductive and a resistance of the fuse element gradually decreases when a current keeps flowing to the fuse element can be eliminated, and another problem on reliability that malfunction occurs in a circuit that operates normally if the circuit is used for a long time period can be solved.

Another object of the present invention is to provide a fuse trimming circuit that can obtain trimming information at the same time as turning on a power supply.

According to a second aspect of the present invention, there is provided a fuse trimming circuit having the fuse trimming circuit of the first aspect, a reset circuit connected across said first power supply node and said second power supply node, for generating a reset signal until a power supply voltage applied to said first and second power supply nodes reaches a voltage at which the said latch circuit can latch when said power supply voltage is turned on, a pulse generating circuit which receives an input pulse having a logical level and generates a fourth pulse having a pulse width in response to a change of the logical level of said input pulse, and a gate circuit which obtains a logical product of said reset signal and said fourth pulse and generates said input pulse corresponding to said logical product to said controlling circuit.

According to the second aspect of the present invention, the gate circuit obtains a logical product of the reset signal generated from the reset circuit when the power supply is turned on and the fourth pulse generated from the pulse generating circuit, and sends the input pulse corresponding to the logical product to the controlling circuit, so that trimming information can be obtained by automatically determining either a blown state or an un-blown state of the fuse element 35-2 when a power supply is turned on, and trimming information can be obtained by controlling the input signal after the power supply is turned on and determining either a blown state or an un-blown state of the fuse element 35-2.

Another object of the present invention is to provide a fuse trimming circuit that can improve of the reliability of determining a blown state or an un-blown state of a fuse element. According to a third aspect of the present invention, there is provided a fuse trimming circuit having a fuse trimming circuit, a reset circuit, an error-correcting circuit, an error-detecting circuit, a first pulse generating circuit, a second pulse generating circuit, and a gate circuit.

The reset circuit connected across said first power supply node and said second power supply node generates a reset signal until a power supply voltage applied to said first and said second power supply nodes reaches a voltage at which the said latch circuit can latch when said power supply voltage is turned on.

The error-correcting circuit holds said trimming information retained in said latch circuit on the basis of a fifth pulse which inverts said third pulse generated from said controlling circuit and holds said trimming information as trimming output information, said error-correcting circuit which latches again said trimming information retained in said latch circuit on the basis of said fifth pulse which inverts said third pulse generated from said controlling circuit again and corrects an error causing in said trimming output information when said error causing in said trimming output information is detected.

The error-detecting circuit compares said trim information retained in said latch circuit with said trimming output information retained in said error-correcting circuit, detects a presence of an error in said trimming information, and generates an error-detecting signal on the basis of said third pulse when detecting an error in said trimming information.

The first pulse generating circuit generates a fourth pulse having a pulse width in response to an input signal received therein having a logical level and in response to a change of said logical level of said input signal.

The second pulse generating circuit generates an error-correcting pulse having a pulse width in respond to said error-detecting signal.

The gate circuit obtains a logical product on said reset signal and said error-correcting pulse and generating said input pulse corresponding to said logical product to said controlling circuit of said fuse trimming circuit.

According to the third aspect of the present invention, the error-detecting circuit and the error-correcting circuit are provided. When trimming information held in the error-correcting circuit causes an error, the error can be self-corrected. When trimming information held in the latch circuit causes an error, either a blown state or an un-blown state of fuse element are determined, and the error is self-corrected. Thereby, reliability of the fuse trimming circuit can be improved.

DETAILED DESCRIPTION OF THE INVENTION

A fuse trimming circuit according to a first to third embodiments of the present invention is provided with a controlling circuit, a bias circuit, a fuse-state determining circuit, and a latch circuit.

The controlling circuit generates a first pulse which is generated by delaying an input pulse, a second pulse which is generated by delaying the first pulse, and a third pulse having a pulse width from a leading edge of the first pulse to a trailing edge which is generated by a trailing edge of the second pulse. The bias circuit connected across a first power supply node and a second power supply node, generates a bias voltage during a time period of a pulse width in response to said third pulse.

The fuse-state determining circuit has a first transistor (a MOS transistor), a first output node, a second transistor (a MOS transistor), and a resistive element which are connected in series between the first power supply node (a VDD node) and the second power supply node (GND). The fuse-state determining circuit has a third transistor (a MOS transistor), a second output node, a forth transistor (a MOS transistor), and a fuse element. The first and third transistors is turned on in response to said first pulse, and the second and the fourth transistors turns on in response to said bias voltage. A resistance of the resistive element is larger than that of the fuse element in an un-blown state and smaller than that of the fuse element in a blown state.

The latch circuit connected across the first power supply node and the second power supply node amplifies a voltage difference across the first and the second nodes and holds the voltage difference as trimming information which represents a blown state or an un-blown state of the fuse element.

Figure 1:
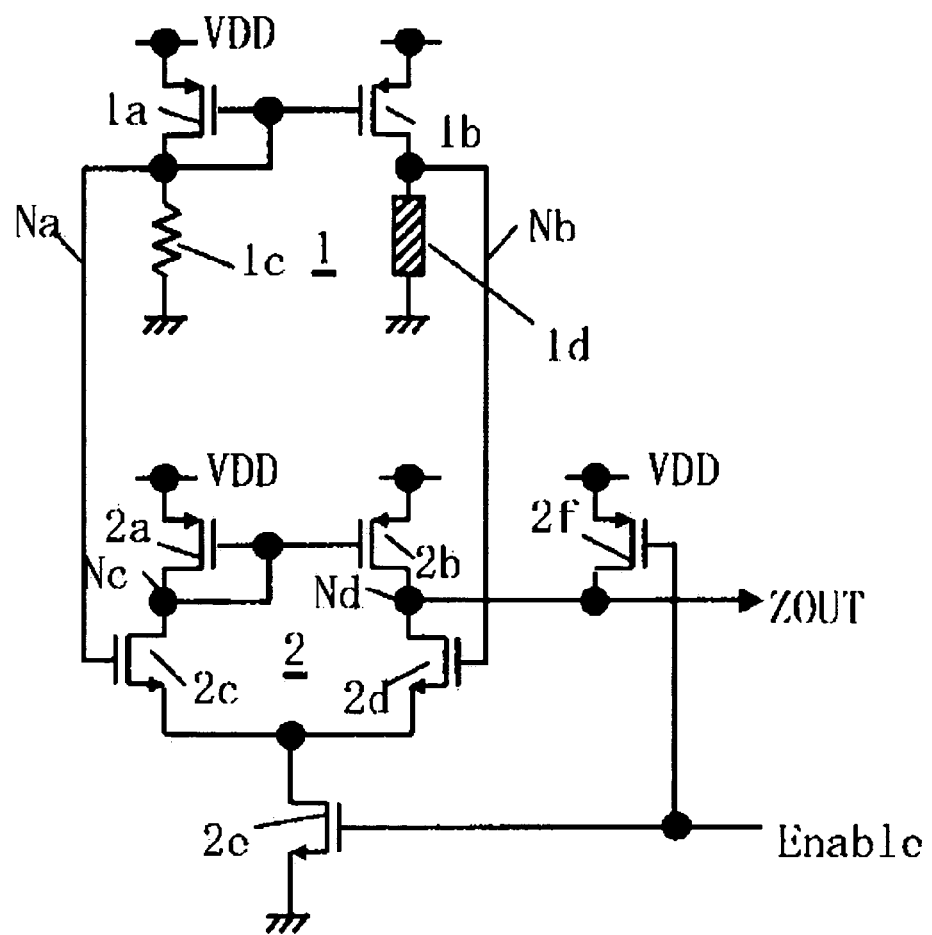
FIG. 1 is a circuit diagram showing a conventional fuse trimming circuit.
Figure 2:
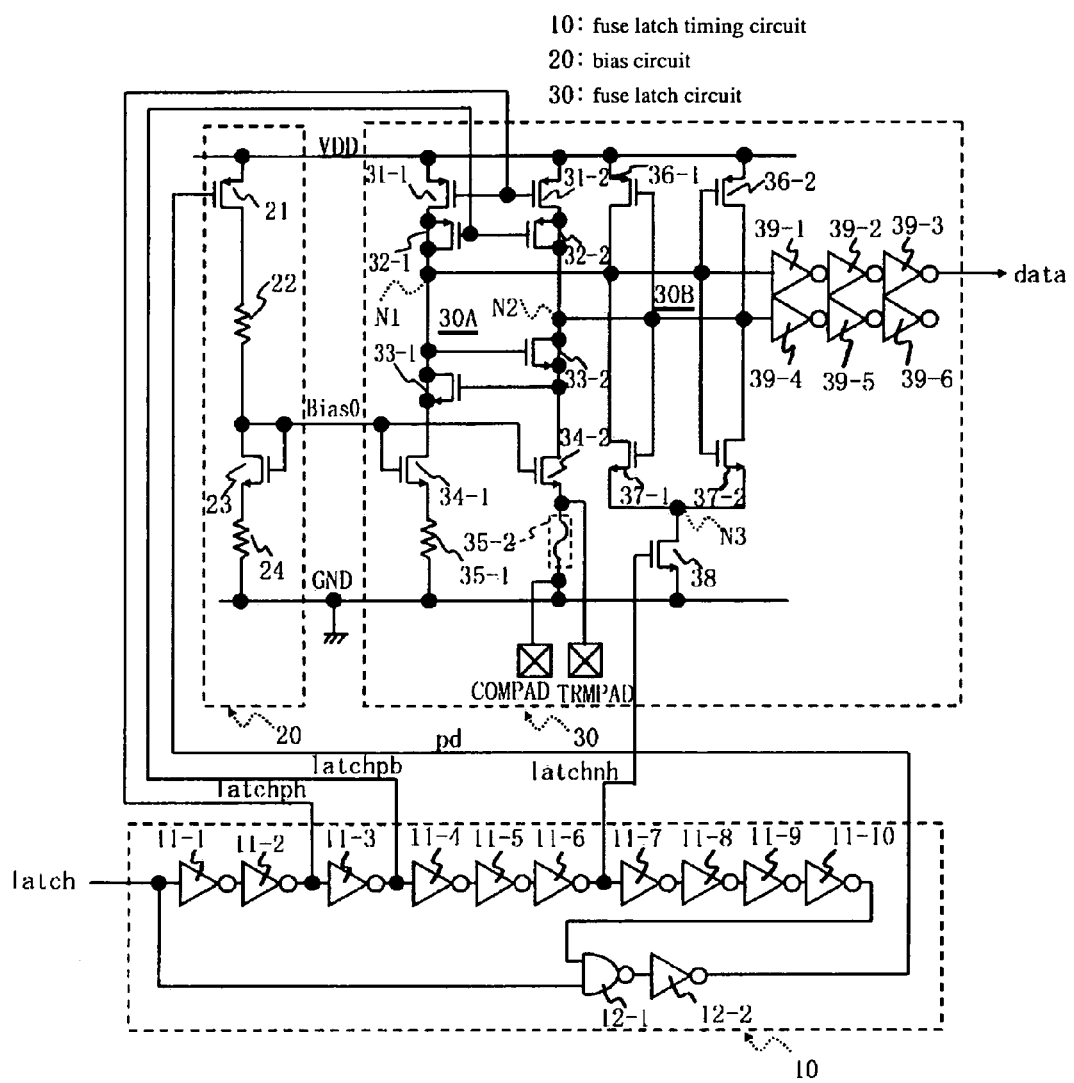
FIG. 2 is a circuit diagram showing a fuse trimming circuit according to a first embodiment of the present invention.

FIG. 2 is a circuit diagram showing a fuse trimming circuit according to a first embodiment of the present invention.

The fuse trimming circuit is provided with a controlling circuit, for example, a fuse latch timing circuit 10, a bias circuit 20, and a fuse latch circuit 30. The fuse latch timing circuit 10 receives an input pulse "latch" and outputs a first pulse "latchph" for timing which is generated by delaying the input pulse "latch", an inverted pulse "latchpb" which is generated by delaying and inverting the first "latchph", a second pulse "latchnh" which is generated by delaying the inverted pulse "latchpb", and a third pulse "pd". The bias circuit 20 outputs a bias voltage "Bias0" in response to the pulse "pd". The fuse latch circuit 30 connected across the first power supply node and the second power supply node amplifies a voltage difference across the first and the second nodes and holds the voltage difference as trimming information which represents a blown state or an un-blown state of the fuse element 35-2.

The fuse latch timing circuit 10 is provided with plural inverters 11-1 to 11-10 which are connected in cascade in sequence. These inverters delay the input pulse "latch" in sequent. A second inverter 11-2 generates the pulse "latchph", a third inverter 11-3 generates the pulse "latchpb" which is generated by inverting the pulse "latchph", and a sixth inverter 11-6 generates the pulse "latchnh". An inverter 11-10 is connected to a two-input NAND gate 12-1. The two-input NAND gate 12-1 performs a negative AND operation on an output pulse generated from the inverter 11-10 and the input pulse "latch". An output terminal of the NAND gate 12-1 is connected to an inverter 12-2 which generates the pulse "pd".

The bias circuit 20 is provided with a PMOS 21 whose source is connected to the first power supply node (VDD), whose gate receives the pulse "pd" generated from the inverter 12-2, and whose drain is connected in series to a resistive element 22, a drain and a source of a NMOS 23, a resistive element 24, and the second power supply node (GND). The PMOS 21 is turned on in respond to the pulse "pd". A bias voltage "Bias0" generated from a connection point where the drain and the gate of the NMOS 23 are connected to each other is supplied to the fuse latch circuit 30.

The fuse latch circuit 30 is provided with a fuse-state determining circuit 30A which determines either a blown state or an un-blown state of the fuse element 35-2 and a latch circuit 30B which holds the determination as trimming information "data".

The fuse-state determining circuit 30A is provided with a first and a third transistors, for example, PMOS's 31-1 and 31-2. Each gate of PMOS's 31-1 and 31-2 connected to each other receives the pulse "latchph", and each source of PMOS's 31-1 and 31-2 is connected to a VDD node. The drain of the PMOS 31-1 is connected in series to a first capacitor, for example, a PMOS capacitor 32-1, a first output node N1, a second capacitor, for example, a NMOS capacitor 33-1, a second transistor, for example, a NMOS 34-1, a resistive element 35-1, and the GND. A drain and a source of the PMOS capacitor 32-1 are connected to each other. A drain and a source of the NMOS capacitor 33-1 are connected to each other. A drain and a source of the NMOS capacitor 34-1 are connected to each other. The drain of the PMOS 31-2 is connected in series to a third capacitor, for example, a PMOS capacitor 32-2, a second output node N2, a fourth capacitor, for example, a NMOS capacitor 33-2, a fourth transistor, for example, a NMOS 34-2, a fuse element 35-2, and the GND. A drain and a source of the PMOS capacitor 32-2 are connected to each other. A drain and a source of the NMOS capacitor 33-2 are connected to each other. A drain and a source of the NMOS capacitor 34-2 are connected to each other.

Each gate of PMOS capacitors 32-1 and 32-2 connected to each other turns on when receiving the pulse "latchpb" having "L" level. The PMOS's 32-1 and 32-2 are provided to prevent a switching noise occurred when the PMOS's 31-1 and 31-2 change from on to off.

A gate of the NMOS capacitor 33-1 connected to a source of the NMOS 33-2 is activated by the source voltage of the NMOS 33-2. A gate of the NMOS capacitor 33-2 connected to a drain of the NMOS capacitor 33-1 turns on when the drain voltage of the NMOS capacitor 33-1 is "H". These NMOS capacitors 33-1 and 33-2 are provided to prevent a switching noise occurred in the NMOS's 34-1 and 34-2. The NMOS's 34-1 and 34-2 turn on when the bias voltage "Bias0" received in each gate of the NMOS's 34-1 and 34-2 is "H" level. A COMPAD and a TRMTAD are connected to both ends of the fuse element 35-2, respectively. The fuse element 35-2 can be a blown state by applying a voltage or a current between the COMPAD and the TRMTAD.

The latch circuit 30B is connected to power output nodes N1 and N2. The latch circuit 30B is provided with a first inverter having a PMOS 36-1 and a NMOS 37-1 which are connected across the VDD node and a node N3, a second inverter having a PMOS 36-2 and a NMOS 37-2 which are connected across the VDD node and the node N3, and a NMOS 38 connected across node N3 and GND. The first inverter and the second inverter, whose input and output terminals are cross-connected to each other, compose a latch part including an inverter positive-feedback circuit that amplifies a voltage difference between the nodes N1 and N2 and holds the difference voltage as trimming information "data" The NMOS 38, whose drain is connected to the node N3 and whose source is connected to the GND, turns on in respond to the pulse "latchnh" having "H" level and activates the latch circuit 30B.

Plural inverters 39-1, 39-2, and 39-3 are connected in cascade to the output node N1 and 39-4, 39-5, and plural inverters 39-6 are connected in cascade to the output node N2. It should be noted that number of the buffer inverters is not limited to three like that shown in FIG. 2.

The NMOS's 34-1 and 34-2 in the fuse latch circuit 30 have the same dimension. The NMOS capacitors 33-1 and 33-2 have the same dimension. The NMOS capacitor 33-1 and the NMOS 34-1 have the same dimension. The NMOS capacitor 34-1 and the NMOS 34-2 have the same dimension. A resistance of the resistive element 35-1 (R35-1) is larger than that of the fuse element 35-2 (R35-2) in un-blown state. The PMOS 31-1 and the PMOS 31-2 have the same dimension. The PMOS capacitors 32-1 and 32-2 have the same dimension. The NMOS 37-1 and the NMOS 37-2 provided in the latch circuit 30B have the same dimension, and the PMOS 36-1 and the PMOS 36-2 have the same dimension.

Figure 3:
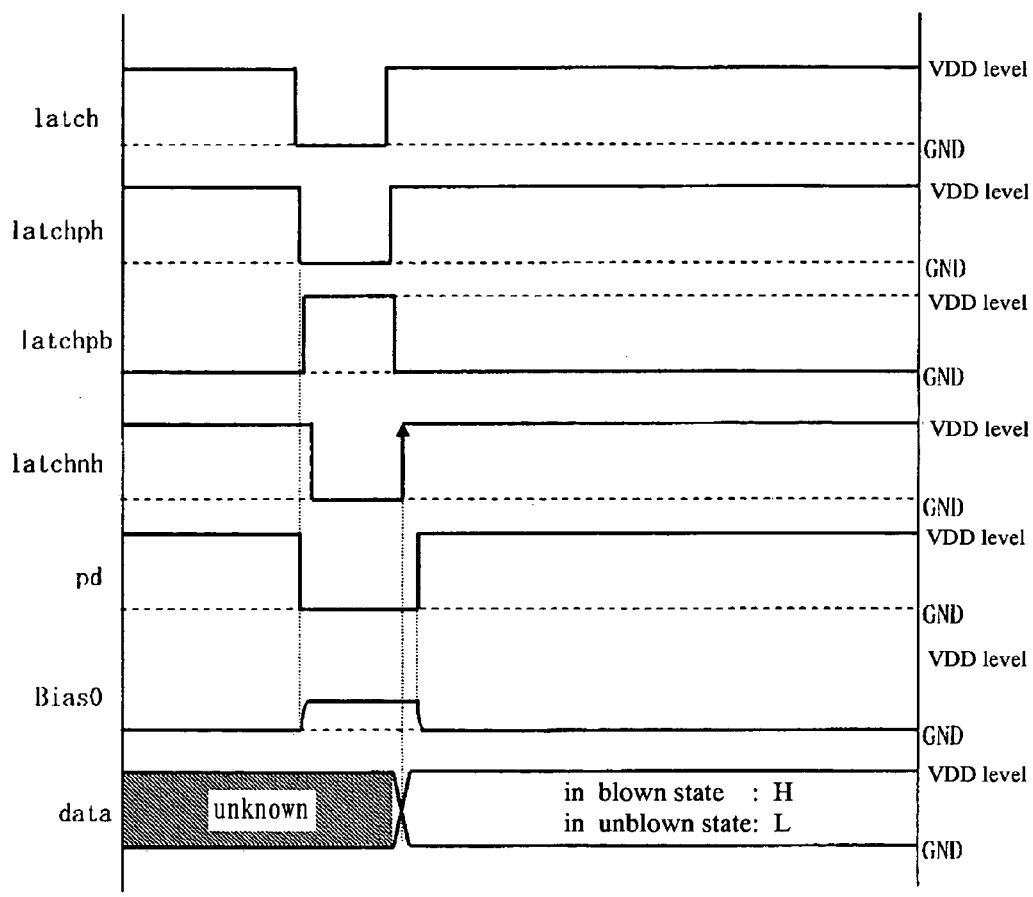
FIG. 3 is a timing diagram showing an operation timing of the fuse trimming circuit according to the first embodiment of the present invention.

FIG. 3 is a timing diagram showing an operation of the circuit in FIG. 2.

When the input pulse "latch" changes from "H" (VDD) level to "L" (GND) level, the "pd", the "latchph", and the "latchnh" changes from H to L. On the other hand, the "latchpb" changes from "L" level to "H" level.

When the pulse "pd" changes from "H" to "L" level, the PMOS 21 in the bias circuit 20 turns on, thus causing a drain current Ids23 given by a following equation (1) to the PMOS 21, the resistive element 22, the NMOS 23, and the resistive element 24 and causing an bias voltage "Bias0" given by a following equation (2) at a drain and a gate of the NMOS23. When a voltage between a drain and a source of the PMOS 21 which generates when the PMOS 21 is turned on, a voltage between a gate and a source of the NMOS 23, and a threshold voltage of the NMOS23 are denoted by Vdsat21, Vgs23, and Vth23, respectively, the drain current Ids23 and the bias voltage "Bias0" are given as follows, $$Ids23=(VDD-Vdsat21-Vgs23)/(R22+R24) \quad (1)$$

$$Bias0=(VDD-Vdsat21-Vgs23)/(R22+R24)*R24+Vth23 \quad (2)$$

Vdsat21 is a voltage between a drain and a source which generates when the PMOS 21 is turned on. Vgs23 is a voltage between a gate and a source of the NMOS 23. Vth23 is a threshold voltage of NMOS23.

The PMOS's 31-1 and 31-2 turn on because the pulse "latchph" received in gates of PMOS's 31-1 and 31-2 are "L" level. Gates of NMOS's 34-1 and 34-2 is applied to the bias voltage "Bias0", thus causing drain currents Ids 34-1 and Ids 34-2 to NMOS's 34-1 and 34-2.

When the fuse element 35-2 is in an unblown state, a resistance of the fuse element 35-2 (R35-2) in the un-blown state is smaller than that of the resistive element 35-1 (R35-1). As a source resistance of a NMOS (Rs) increasing, a transconductance value (gm) decreases. Hence, drain currents Ids 34-1 and Ids 34-2 flowing to NMOS's 34-1 and 34-2 are determined by the source resistance Rs if NMOS's 34-1 and 34-2 are applied to the same dimension and gate voltage with each other. There is a relation as follows, $$Ids\ 34\text{-}1 < Ids\ 34\text{-}2 \quad (3).$$

Drain current Ids34-1 and Ids34-2 flows to PMOS31-1 and PMOS31-2. Voltages of nodes N1 and N2 are determined by a voltage drop which is caused by on-resistance of the PMOS 31-1 and the PMOS 31-2. Because the PMOS 31-1 and the PMOS 31-2 have the same dimension, on-resistances of them Ron31-1 and Ron31-2 are equal. Therefore, voltages VN1 and VN2 of nodes N1 and N2 are determined from the relation between Ids34-1 and Ids34-2 given by (2), and following relation is obtained.

$$VN1>VN2 \quad (4)$$

When a resistance of the fuse element 34-2 in an un-blown state R34-2 is larger than that of the resistive element 35-1 R35-1, a relation of drain currents Ids 34-1 and Ids 34-2 flowing to NMOS's 34-1 and 34-2 is as follows:

$$Ids\ 34\text{-}1>Ids\ 34\text{-}2 \quad (5)$$

Voltages VN1 and VN2 of nodes N1 and N2 are determined from the relation between Ids34-1 and Ids34-2 given by (5), and the following relation is obtained.

$$VN1<VN2 \quad (6)$$

When the input pulse "latch" changes from "H" (VDD) level to "L" (GND) level, the pulse "pd", the pulse "latchph", and the pulse "latchnh" changes from "H" to "L", and the "latchpb" changes from "L" level to "H" level. The latch part including an inverter positive-feedback circuit having PMOS's 36-1, 36-2 and NMOS's 37-1, 37-2 that amplifies a voltage difference between the nodes N1 and N2 and holds the difference voltage as trimming information "data"

When a relation of voltages of the node N1 and N2 are given by (4), the nodes N1 and N2 are forced to be "H" level and "L" level, respectively. The level of the nodes N1 and N2 are driven by inverter 39-1 to 39-3, and the trimming information "data" having "L" level is generated. When a relation of voltages of the node N1 and N2 are given by (6), the nodes N1 and N2 are forced to be "L" level and "H" level, respectively. The level of the nodes N1 and N2 are driven by inverter 39-1 to 39-3, and the trimming information "data" having "H" level is generated. That is, the trimming information "data" is forced to be "L" in an un-blown state of the fuse element 34-2 and forced to be "H" in a blown state of the fuse element 34-2.

When the pulse "pd" changed to "H" level, the PMOS 21 turns off, resulting in no current flowing to the PMOS 21, the resistive element 22, the NMOS 23, and the resistive element 24.

Therefore, the bias voltage "Bias0" decreases to change to "L" level, and NMOS's 34-1 and 34-2 turns off, resulting in zero current flowing to the bias circuit 20 and the fuse latch circuit 30.

The fuse trimming circuit according to the present invention has effects as follows:

The latch part includes the inverter positive-feedback circuit having the NMOS 34-1 and the NMOS 34-2 both of which the same bias voltages "Bias0" are applied, the resistive element 35-1 and the fuse element 35-2, a pair of the PMOS's 31-1 and 31-2, the PMOS's 36-1 and 36-2, and NMOS's 37-1 and 37-2.

The fuse-state determining circuit 30A determines either a blown or an un-blown state of the fuse element 35-2 by comparing the drain currents Ids34-1 and Ids34-2 which are determined from resistances of sources of the NMOS's 34-1 and 34-2. The latch circuit 30B holds the determination obtained by the fuse-state determining circuit 30A. After the determining operation, the bias circuit 20 generating the bias voltage "Bias0" which is applied to the NMOS's 34-1 and 34-2 is turned off, and the bias voltage "Bias0" is GND level. The drain currents Ids34-1 and Ids34-2 do not flow. Thereby, the first embodiment of the present invention can determine either a blown or an un-blown states of the fuse element 35-2 when the resistance of the resistive element 35-1 (R35-1) is smaller than that of the fuse element 35-2 (R35-2) even if the fuse element is not completely blown.

Since a current flows to the fuse element 35-2 in an incomplete-blown state only when a state of the fuse element 35-2 is determined, one of the conventional problem that a fuse element in a blown state is gradually conductive and a resistance of the fuse element gradually decreases when a current keeps flowing to the fuse element can be eliminated, and another problem that a malfunction is caused in the circuit that operates normally can be solved Since a current flows to the circuits only when a state of the fuse element 35-2 is determined, the fuse trimming circuit of the first embodiment is applicable for a low-power type LSI.

PMOS capacitors 32-1 and 32-2, and NMOS capacitors 33-1 and 33-2, are provided in the fuse-state determining circuit 30A to prevent a switching noise occurred in the PMOS capacitors 31-1 and 31-2, and the NMOS 34-1 and 34-2, resulting in improvement of accuracy and reliability in determining either a blown state or an un-blown state of the fuse element 35-2.

Figure 4:
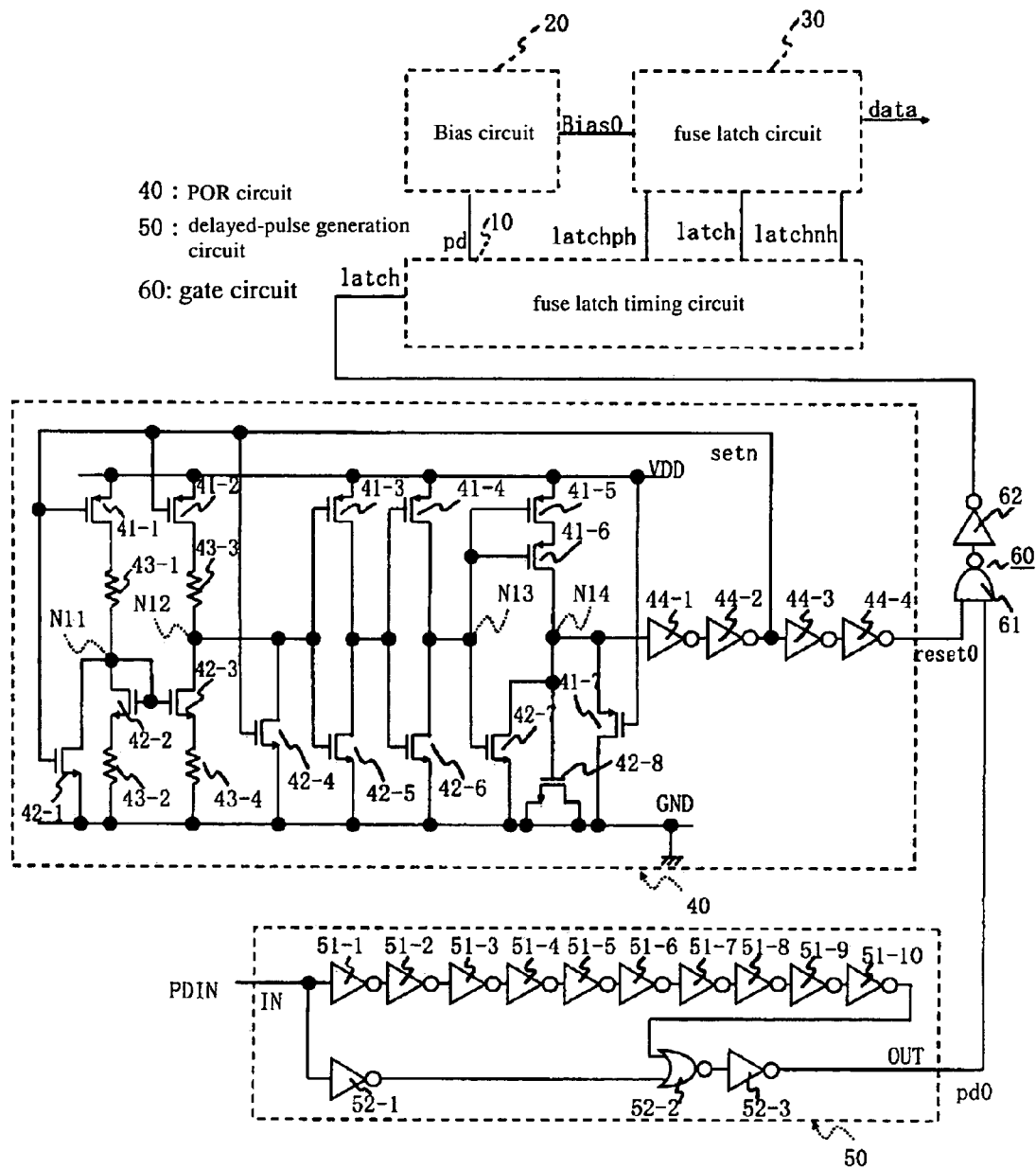
FIG. 4 is a circuit diagram showing a fuse trimming circuit according to a second embodiment of the present invention.

FIG. 4 is a circuit diagram showing a fuse trimming circuit according to the second embodiment of the present invention. The same symbols as the first embodiment are denoted in FIG. 4

As shown in FIG. 4, the fuse trimming circuit of the second embodiment in addition to the fuse trim circuit of the first embodiment that has the fuse latch timing circuit 10, the bias circuit 20, and the fuse latch circuit 30.is provided with a power on reset (POR) circuit 40, a delayed-pulse generation circuit 50, and gate circuit 60. The POR circuit 40 outputs a reset signal "reset0" which generates when a power supply is switched on. The delayed-pulse generation circuit 50 delays an input signal "PDIN" and generates a fourth pulse "pd0". The gate circuit 60 inputs the reset signal "reset0" from the POR circuit 40 and the pulse "pd0" from the delayed-pulse generation circuit 50, and outputs a pulse "latch" to the fuse latch timing circuit 10.

The POR circuit 40 is provided with PMOS's 41-1 to 41-7, NMOS's 42-1 to 42-7, NMOS capacitors 42-8, resistive elements 43-1 to 43-4, a buffer having plural inverters, for example, four inverters 44-1 to 44-4. The reset signal "reset0" having "L" level generated from the POR circuit 40 until the fuse latch circuit 30 latches after the power supply is switched on.

A PMOS 41-1, a resistive element 43-1, a node N11, and a NMOS 42-1 are connected in series between a first power supply node (a VDD node) and a second power supply node (a GND node). Each gate of the PMOS 41-1 and NMOS 42-1 is controlled by a signal "setn". A NMOS 42-2 having a gate and a drain connected to each other and a resistive element 43-2, are connected in series between a node N11 and the GND. Similarly, the PMOS41-2 whose gate is controlled by the signal "setn", a resistive element 43-2, a node N12, a NMOS42-3 whose gate is connected to a gate of the NMOS 42-2, and a resistive element 43-4 are connected in series between the VDD node and the GND. The PMOS42-4 whose gate is controlled by the signal "setn" is connected across the node N12 and the GND.

A first inverter including a PMOS 41-3 which inverts a voltage at the node N12 and a NMOS 42-5 and a second inverter including a PMOS 41-4 which inverts the output voltage and outputting the node N13 and NMOS 42-6, are connected in cascade between the VDD node and the GND. Each gate of PMOS's 41-5, 41-6 and a NMOS 42-7 is connected to the node N13. Drains and sources of PMOS's 41-5 and 41-6, a node N14, and a drain and a source of the NMOS 42-7 are connected in series between the VDD node and the GND. A gate of a NMOS capacitor 42-8 is connected to the node N14, and a drain and a source of the NMOS capacitor 42-8 are connected to the GND. A source and a drain of a PMOS 41-7 whose gate is connected to the VDD are diode-connected across the node N14 and the GND.

A buffer including four inverters 44-1 to 44-4 which receives a signal from the node 14 and generate a reset signal "reset0" is connected to the node N14. The second inverter 44-2 generates a signal "setn" which is fed back to each gate of the PMOS's 41-1, 41-2 and the NMOS's 42-1 and 42-4.

The delayed-pulse generation circuit 50 receives an input voltage "PDIN" having a logical level from an input terminal IN and generates a pulse "pd0" having "L" level and a pulse width to an output terminal OUT when the input voltage "PDIN" changes from "H" level to "L" level. The delayed-pulse generation circuit 50 is provided with plural inverters, for example, ten inverters 51-1 to 51-10 which delay a timing of a leading edge of the input voltage "PDIN" in sequent when the input voltage "PDIN" changes from "H" level to "L" level. These inverters 51-1 to 51-10 are connected in cascade. In addition, the delayed-pulse generation circuit 50 is provided with an inverter 52-1 which inverts the input potential "PDIN". An output terminal of the inverter 52-1 is connected to a two-input AND gate 52-2. The AND gate 52-2 performs a logical AND operation on the output voltage generated from the inverter 51-1 and the input voltage "PDIN", and generates the pulse "pd0". An output terminal of the AND gate 52-2 is connected to the gate circuit 60. An NAND gate 61 performs a NAND operation on the reset signal "reset0" and the pulse "pd0". An output terminal of the NAND gate 61 is connected to the inverter 62 to generate the input pulse "latch" to the fuse latch timing circuit 10.

Resistive elements 43-1 and 43-3 in the POR circuit 40 have the same resistance as that of a resistive element 22 in the bias circuit 20. A resistive element 43-2 in the POR circuit 40 and a resistive element 24 in the bias circuit 20 have the same resistance. A resistive element 43-4 in the POR circuit 40 has a smaller resistance than resistive elements 43-2 and 43-3 have. The NMOS 42-2 and the NMOS 42-3 in the POR circuit 40 have the same dimension, and the NMOS 34-1 in the fuse latch circuit 30 and the NMOS 23 in the bias circuits 20 have the same dimension. Similarly, the PMOS 41-1 and the PMOS 41-2 in the POR circuits 40 have the same dimension.

Figure 5:
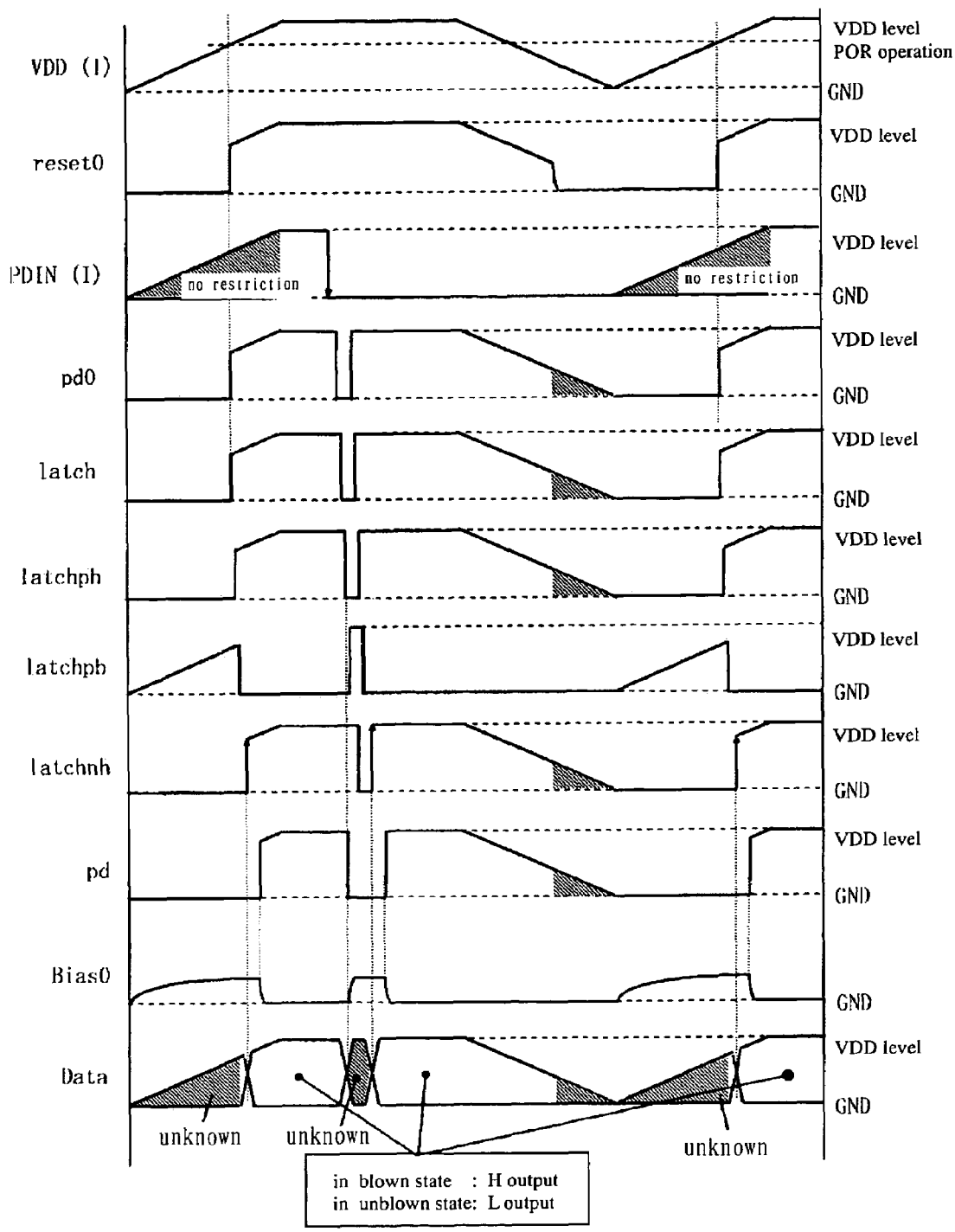
FIG. 5 is a timing diagram showing an operation timing of the fuse trimming circuit according to the second embodiment of the present invention.

FIG. 5 is a timing diagram showing an operation timing of the fuse trimming circuit according to the second embodiment of the present invention. As shown in FIG. 5, the POR circuit 40 generates a reset signal "reset0" having "L" (GND) level until a voltage at which the fuse latch circuit 30 can latch is more than "H" (VDD) level and generates a reset signal "reset0" having "H" when the voltage at which the fuse latch circuits can latch is more than VDD level.

The bias circuit 20 operates and a drain current Isd23 flows to the NMOS 23, if a voltage Vgs23 between a gate and a source of the NMOS 23 is larger than a threshold voltage Vth23 of the NMOS 23. The VDD is given by an inequality (7).

$$VDD > Vdsat21 + Vth23 \tag{7}$$

The bias voltage Bias is received in gates of the NMOS's 34-1 and 34-2 in the fuse latch circuit 30 and the NMOS 23 in the bias circuit 20. Since the NMOS's 34-1 and 34-2 in the fuse latch circuit 30 and the NMOS 23 in the bias circuit 20 have the same dimension, the drain current Ids34-1 flowing to the NMOS34-1 and the drain current Isd34-2 flowing to the NMOS 34-2 can be generated if the VDD is given by (7).

In a latch part including an inverter positive-feedback circuit having the PMOS's 36-1, 36-2 and the NMOS's 37-1, 37-2 in the fuse latch circuit 30. A voltage difference across nodes N1 and N2 is amplified and hold when the NMOS 38 turns on if a voltage Vgs between gates and sources of the PMOS 36-1, NMOS 37-1, and PMOS 36-2 and NMOS 37-2 is larger than a threshold voltage Vth. The VDD is given in inequalities (8) and (9)

$$VDD > Vth37\text{-}1(=Vth37\text{-}2) \quad (8)$$

$$VDD > Vth36\text{-}2(=Vth36\text{-}2) \quad (9)$$

That is, the fuse latch circuit 30 can latch if the VDD level is given in the (7), (8), and (9). A condition of the inequality (8) is included in that of the expression (7).

When VDD of the POR circuit 40 is the GND level, electric charge in the gate of the NMOS capacitor 42-8 is discharged through the PMOS 41-7 which is diode-connected. The voltage of node N14 decreases to the GND level if VDD keeps the GND level for a long time period. When VDD increases from "L" level, the signal "setn" generated from the POR circuit 40 changes to "L" (GND level), and the "setn" having "L" level is received to the gate of PMOS 41-1 and NMOS 42-1. Therefore, the NMOS 42-1 is turned off. The PMOS's 41-1 and 41-2 can be turned off if the VDD is more than a threshold voltage Vth41-1 of the PMOS 41-1 and a threshold voltage Vth41-2 of the PMOS 41-2. When VDD is given by inequalities (10), (11), $$VDD < Vdsat41\text{-}1 + Vth42\text{-}2 (= Vdsat21 + Vth23) \quad (10)$$

$$VDD < Vdsat41\text{-}2 + Vth42\text{-}3 \quad (11)$$

voltages VN11 and VN12 of node N11 and node N12 are given by as follows:

$$VN11 = VDD - Vdsat41\text{-}1 \approx VDD \text{ level}$$

$$VN12 = VDD - Vdsat41\text{-}2 \approx VDD \text{ level}$$

The VN11 and VN12 are nearly "H" level (VDD level) because the drain current Ids42-2 of the NMOS 42-2 and the drain current Ids42-3 of NMOS 42-3 are minute. Because the voltage at node N12 VN12 and the voltage at node N13 VN13 are "H" level (VDD level), the NMOS42-7 turns on, and the PMOS's 41-5, 41-6 turn off. Because the node N14 keeps the GND level, the signal "setn" keeps "L" level and the reset signal "reset0" keeps "L" level.

As mentioned above, the POR circuit 40 generates a reset signal "reset0" having "L" level until an operable voltage are supplied to the bias circuit 20. As the VDD increasing, the inequalities (10), (11) are not fulfilled, drain current Ids42-2 of the NMOS42-2 and drain current Ids42-3 of the NMOS 42-3 increase Voltages VN11 and VN12 of node N11 and node N12 given by (12) is less than VDD level.

$$VN11 = VDD - Vdsat41\text{-}1 - Ids42\text{-}2 * R43\text{-}1$$

$$VN12 = VDD - Vdsat41\text{-}2 - Ids42\text{-}3 * R43\text{-}3 \quad (12)$$

Since a resistance of the resistive element 43-4 connected to a source of the NMOS 42-3 is smaller than that of the resistive element 43-2 connected to a source of the NMOS 42-2, the drain current Ids42-2 of NMOS 42-2 is larger than drain current Ids42-3 of NMOS 42-3, the voltage VN12 at the node N12 decreases, the NMOS 42-3 operates in non-saturated region. Voltage VN12 at the time is given by an equation (13), $$VN12 = Vdsat42\text{-}3 + Ids42\text{-}3 * R43\text{-}4 \quad (13)$$

If a difference between the voltage VN12 and VDD is larger than a threshold voltage Vth 41-3 of the PMOS 41-3, that is, Vth41-3 is given by (14), $$Vth41\text{-}3 < VDD - VN12 = Vdsat41\text{-}2 - Ids42\text{-}3 * R43\text{-}3 \quad (14)$$

At this time, if the voltage VN12 is less the threshold Vth42-5 of NMOS42-5,

NMOS42-5 is changed from on to off and the node N13 is changed from "H" level to "L" level.

From (13) and (14), VDD is given (15). VDD given by (15) is higher than that given by (9).

NMOS42-5 is changed from on to off and the node N13 is changed from "H" to "L". From (13) and (14), VDD is given (15). VDD given by (15) is higher than that given by (9).

When a voltage at the node N13 changes from "H" level to "L" level, the NMOS 42-7 changes from on to off. PMOS's 41-5 and 41-6 change from off to on. A gate capacitance of the NMOS capacitor 42-8 begins to be charged and the voltage VN 14 at the node N14 increases to be VDD level finally. When the voltage V14 at the gate N14 is VDD level, the output signal "setn" of the inverter 44-2 changes from "L" level to "H" level, the PMOS's 41-1 and 41-2 turn off the drain current Ids 42-2 of the NMOS 42-2 and the drain current Ids 42-3 are cut off. At the same time, NMOS 42-1, 42-4 changes from ON to OFF, and the voltage at the nodes N11 and N12 is "L" level, the voltage at the N11 and N12 is fixed to be "L" level. When the voltage VN14 at the node 14 is VDD level, the output signal "setn" of the inverter 44-2 changes from "L" level (GND level) to "H" level (VDD level). The reset signal "reset0" generated from the inverter 44-4 is fixed to "H" level (VDD level).

The delayed-pulse generation circuit 50 generates "pd0" having "L" level for a certain time period in response to the changing of input potential "PDIN" from "H" to "L". Therefore, the pulse "pd0" keeps "H" level if the input potential "PDIN" is fixed to "H" level or "L" level even when the power supply is switched on. A logical product on the reset signal "reset0" and the pulse "pd0" is obtained by the NAND gate 61 and the inverter 62 from which the input pulse "latch" is generated and sent to the fuse latch timing circuit 10. The circuit operation in response to changing from "L" level to "H" level of the input pulse "latch", which is similar to the first embodiment of the present invention, is such that the trimming information "data" generated from the inverter 39-3 is "L" level when the fuse element 35-2 is in an un-blown state and the trimming information "data" generated from the inverter 39-3 is "H" level when the fuse element 35-2 is in a blown state. Thus, the steady-state current of each circuit is zero.

When the input potential "PDIN" changed from "H" level to "L" level after the power supply is turned on, the output pulse "pd0" generated from delayed-pulse generation circuit 50 keeps "L" level for a certain period. Because the reset signal "reset0" is fixed to "H" level(VDD level), the input pulse "latch" of fuse latch timing circuit 10 becomes "L" level for a certain period, too. When the input pulse "latch" changes from "L" to "H" level, the circuit operates in a similar manner as the first embodiment. When the fuse element 35-2 is in an unblown state, the trimming information "data" changes to "L" level. When the fuse element 35-2 is in a blown state, the trimming information "data" changes to "H" level. A steady-state current of each circuit becomes zero.

The second embodiment of the present invention has effects similar to the first embodiment and additionally has the following effect:

The fuse trimming circuit according to second embodiment of the present invention is provided with the POR circuit 40 which generates the reset signal "reset0" having "L" level until the fuse latch circuit 30 can latch and the delayed-pulse generation circuit 50 generating the pulse "pd0" having "L" level for a time period when the input voltage changes from "H" level to "L" level. The reset signal "reset0" and the pulse "pd0". Therefore, trimming information "data" can be obtained by automatically determining either a blown state or an un-blown state of fuse element 35-2 at the time the power supply is turned on. In addition, the trimming information "data" can be obtained by determining either a blown or an un-blown states of fuse element 35-2 again by lowering the input voltage "PDIN" from "H" level to "L" level after the power supply is turned on. Thereby, the fuse trimming circuit according to the second embodiment of the present invention is applicable to LSI etc. which requires for the trimming information "data" at the same time as turning on the power supply and requires for a power down function.

Figure 6:
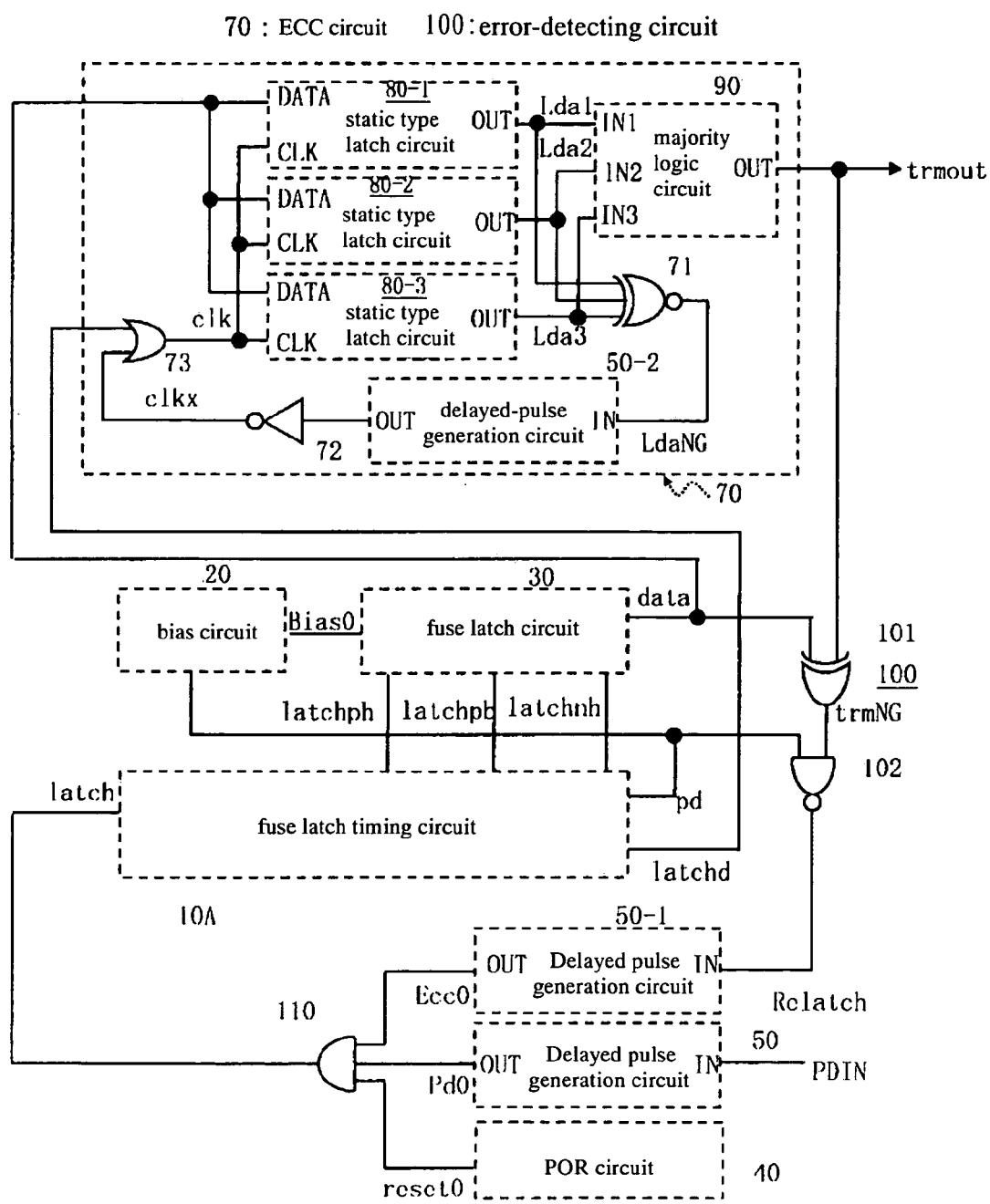
FIG. 6 is a circuit diagram showing a fuse trimming circuit according to a third embodiment of the present invention.

FIG. 6 is a circuit diagram showing a fuse trimming circuit according to a third embodiment of the present invention. The same symbols as the first and the second embodiments are denoted in FIG. 6

As shown in FIG. 6, the fuse trimming circuit according to the third embodiment of the present invention is provided with a fuse latch timing circuit 10A which is different from the fuse latch timing circuit 10 of the first embodiment, a bias circuit 20, a fuse latch circuit 30, a POR circuit 40, a delayed-pulse generation circuit 50, a delayed-pulse generation circuit 50-1, an ECC (error-correcting) circuit 70, an error-detecting circuit 100, and a 3-input AND gate 110. It should be noted that the bias circuit 20, the fuse latch circuit 30, the POR circuit 40, and the delayed-pulse generation circuit 50 are same as those of the second embodiment.

In the fuse latch timing circuit 10A, a new function to output a fifth pulse "latchd" is added to the fuse latch timing circuit 10. The delayed-pulse generation circuit 50-1 is identical with the delayed-pulse generation circuit 50 of the second embodiment. Each of delayed-pulse generation circuits 50 and 50-1 is provided with an input terminal IN and an output terminal OUT. Receiving an error detection signal "Relatch" generated from the error-detecting circuit 100 from the input terminal IN, the delayed-pulse generation circuit 50-1 outputs an error-correcting pulse "Ecc0" having a pulsewidth from the output terminal OUT. A fourth pulse "pd0" generated from the delayed-pulse generation circuit 50, an error correction pulse "Ecc0" generated from the delayed-pulse generation circuit 50-1, and a reset signal "reset0" generated from the POR circuit 40 are received in the three-input AND gate 110. The three-input AND gate performs a logical AND operation on the pulse "pd0", the error correction pulse "Ecc0", and the reset signal "reset0", and then outputs an input pulse "latch" to the fuse latch timing circuit 10A.

The ECC circuit 70 latches trimming information "data" preserved by the fuse latch circuit 30 on the basis of a pulse "latchd" generated from the fuse latch timing circuit 10A and holds the trimming information "data" as trimming output information "trmout". When the ECC circuit 70 detects an error caused in the trimming output information "trmout", the ECC circuit 70 latches again trimming information "data" preserved by the fuse latch circuit on the basis of the pulse "latchd" generated from the fuse latch timing circuit 10A again and corrects the error causing in the trimming output information "trmout". This ECC circuit 70 is provided with three static type latch circuits 80-1 to 80-3, majority logic circuit 90, a three-input exclusive NOR (EXNOR) gate 71, a delayed-pulse generation circuit 50-2, an inverter 72, and a two-input OR gate 73.

Each of the static type latch circuits 80-1 to 80-3 having input terminals DATA, CLK and an output terminal OUT holds the trimming information "data" preserved in the fuse latch circuit 30 on the basis of the pulse "latchd" generated from the fuse latch timing circuit 10A. The majority logic circuit 90 inputs signals "Lda1", "Lda2", and "Lda3" generated from the static type latch circuits 80-1 to 80-3 from input terminals thereof IN1, IN2, and IN3 and generates the trimming output information "trmout" to an output terminal OUT performing a majority logical operation. The three-input EXNOR gate 71 detects errors caused in the output signals "Lda1", "Lda2", and "Lda3" which are compared thereby and generates an error-detecting signal "LdaNG". The correcting means including the delayed-pulse generation circuit 50-2, the inverter 72 and the two-input OR gate 73 correct an error caused in the trimming output information "trmout" on the basis of the pulse "latchd" generated from the fuse latch timing circuit 10A again when the EXNOR gate 71 detects an error caused in the trimming information "data". The static type latch circuits 80-1 to 80-3 latch the trimming information "data" retained in the fuse latch circuit 30.

The delayed-pulse generation circuit 50-2 having the same elements as the delayed-pulse generation circuit 50 receives the detecting signal "LdaNG" generated from the EXNOR gate 71 from the input terminal thereof IN and generates a pulse having a pulse width to an output terminal thereof OUT. The output terminal OUT of the delayed-pulse generation circuit 50-2 is connected to the two-input OR gate 73 via the inverter 72. The two-input OR gate 73 generates a pulse "clk" by performing a logical operation OR between the pulse "latchd" generated from the fuse latch timing circuit 10A and the pulse "clkx" generated from the inverter 72, thus giving the pulse "clk" to each input terminal CLK of the latch circuits 80-1 to 80-3.

The error-detecting circuit 100 is provided with a two-input exclusive OR (EXOR) gate 101 and a two-input NAND gate 102. The EXOR gate 101 receives the trimming information "data" preserved in the fuse latch circuit 30 and the trimming output information "trmout" preserved in the ECC circuit 70, and then generates a detection signal "trmNG" detecting a presence of error in the trimming information "data". The two-input NAND gate 102 generates an error detection signal "ReLatch" to the delayed-pulse generation circuit 50-1 on the basis of the pulse "pd".

A three-input AND gate 110 is connected to the output terminals of the POR circuit 40 and delayed-pulse generation circuits 50, 50-1. The AND gate 110 performs a logical AND operation on the basis of the pulse "pd0", the reset signal "reset0", and the error-correcting pulse "Ecc0" and generates the input pulse "latch" corresponding to the logical AND product to the fuse latch timing circuit 10A.

Figure 7:
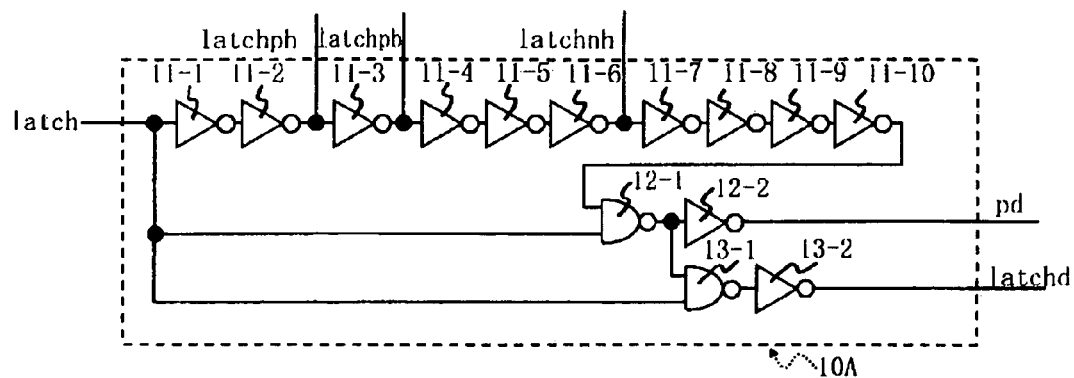
FIG. 7 is a circuit diagram showing a fuse latch timing circuit in the fuse trimming circuit according to the third embodiment of the present invention.

FIG. 7 is an enlarged circuit diagram showing the fuse latch timing circuit 10A of FIG. 6. In the fuse latch timing circuit 10A, a two-input NAND gate 13-1 and inverter 13-2 are added to fuse latch timing circuit 10 in FIG. 2. In the fuse latch timing circuit 10A, a two-input NAND gate 13-1 and an inverter 13-2 are added to the fuse latch timing circuit 10 of the first embodiment of the present invention. The two-input NAND gate 13-1, which are connected to an output of the NAND gate 12-1 and an inverter 13-2, perform a negative AND operation between an output pulse generated from the NAND gate 13-1 and the input pulse "latch". The Inverter 13-2 inverts the pulse generated from the NAND gate 13-1 and generates a pulse "latchd".

Figure 8:
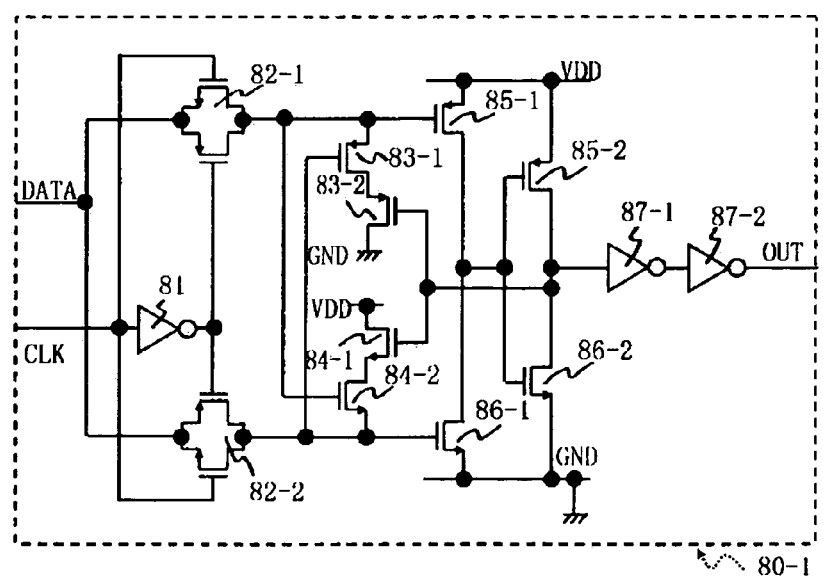
FIG. 8 is a circuit diagram showing a static type latch circuit in the fuse trimming circuit according to the third embodiment of the present invention.

FIG. 8 is an extended circuit diagram showing a static type latch circuit 80-1 in FIG. 6. The static type latch circuit 80-1 having the same circuit structure as other static type latch circuits 80-2, 80-3 includes an inverter 81 which inverts the pulse "clk" received from the input terminal CLK thereof and two analog switches 82-1, 82-2 which receive the trimming information "data" from an input terminal DATA performing on/off operations by the pulse "clk" and an inverting pulse of the "clk". An analogue switch 82-1 includes a PMOS transistor and a NMOS transistor which are connected in parallel with each other. An analogue switch 82-2 includes a PMOS transistor and a NMOS transistor which are connected in parallel with each other. Two PMOS's 83-1, 83-2 are connected in series with each other between an output terminal of the analogue switch 82-1 and a GND. A gate of the PMOS 83-1 is connected to an output terminal of the analogue switch 82-2. Two PMOS's 84-1 and 84-2 are connected in series with each other between an output terminal of the analogue switch 82-2 and a VDD node. A gate of the PMOS 84-2 is connected to an output terminal of the analogue switch 82-1.

A gate of a PMOS 85-1 is connected to an output terminal of the analogue switch 82-1, and a gate of a NMOS 86-1 is connected to an output terminal of analogue switch 82-2. The PMOS 85-1 and the NMOS 86-1 are connected to each other in series across the VDD node and a GND. The input terminal of the inverter consisting of the PMOS 85-2 and the NMOS 86-2 is connected to the nodes of the PMOS 85-1 and the NMOS 86-1. The output terminal of the inverter having the PMOS 85-2 and the NMOS 86-2 is connected to gates of the PMOS 83-2 and the NMOS 84-1 and two buffer inverters 87-1 and 87-2. The inverter 87-2 outputs an output signal "Lda1" from an output terminal thereof OUT.

Figure 9:
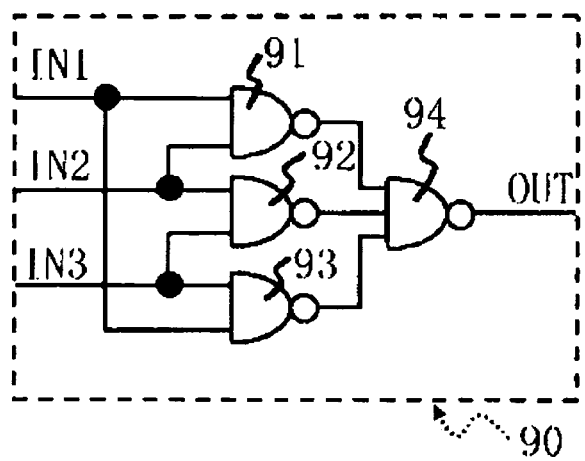
FIG. 9 is a circuit diagram showing a majority circuit in the fuse trimming circuit according to the third embodiment of the present invention.

FIG. 9 is an enlarged circuit diagram showing a majority logic circuit 90 in FIG. 6. As shown in FIG. 9, the majority logic circuit 90 is provided with a three-input NAND gate 94 and three two-input NAND gates 91 to 93 by which signals "Lda1", "Lda2", and "Lda3" received from input terminals IN1, IN2, and IN3, respectively, are compared, thus generating the trimming output information "trmout" from an output terminal thereof OUT.

Figure 10:
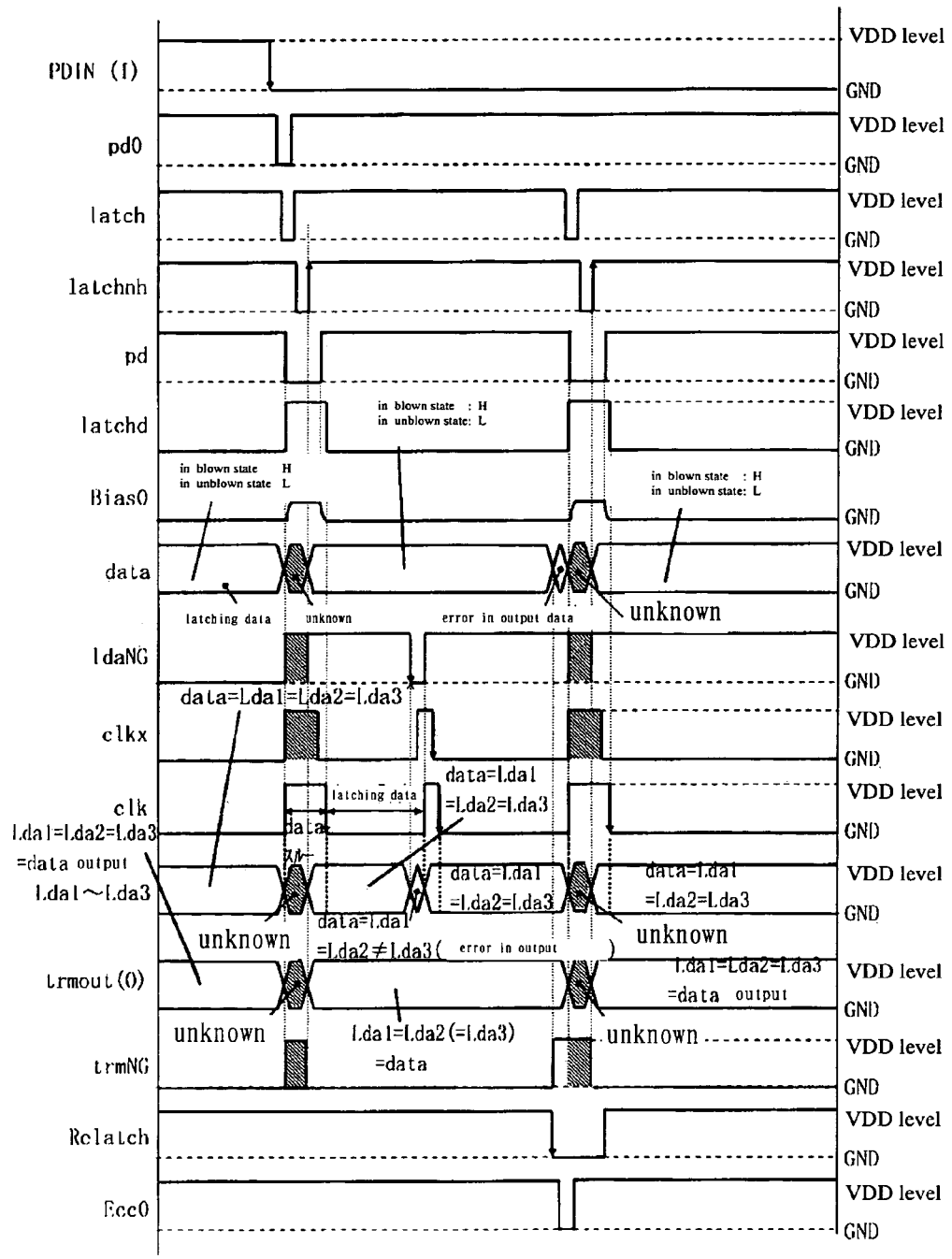
FIG. 10 is a timing diagram showing an operation timing of the fuse trimming circuit according to the third embodiment of the present invention.

FIG. 10 is a timing diagram showing an operation timing of the fuse trimming circuit of the third embodiment in FIG. 6. Pulse waves, when an Input voltage "PDIN" received in the delayed-pulse generation circuit 50 changes from "H" level to "L" level after the power is on, are shown in FIG. 10 for simplifying an explanation of the timing of the circuit.

When the input potential "PDIN" changes from VDD level ("H" level) to GND level ("L" level), the pulse "pd0" generated from the delayed-pulse generation circuit 50 keeps "L" level for a certain period. If both the error-correcting pulse "Ecc0" generated from the delayed-pulse generation circuit 50-1 and the reset signal "reset0" generated from the POR circuit 40 are "H" level, the input pulse "latch" generated from the AND gate 110 keeps "L" level for a certain period. The fuse latch timing circuit 10A, the bias circuit 20, and the fuse latch circuit 30 operate in a similar way of the first embodiment of the present invention. That is, the trimming information "data" generated from the fuse latch circuit 30 changes to "L" level when the fuse element is in an unblown state, and the trimming information "data" is fixed to "H" level when the fuse element 35-2 is in a blown state.

The pulse "pd" and the pulse "latchd" are generated from the fuse latch timing circuit 10A in the third embodiment of the present invention. When the pulse "pd" changes from "H" level to "L" level, the pulse "latchd" changes from "L" level to "H" level at the same time. When the pulse "pd" changes from "L" level to "H" level, the pulse "latchd" changes from "H" level to "L" level with a little delay time. This pulse "latchd" is taken a logical add with the OR gate 73 of the ECC circuit 70 which generates the pulse "clk", and the "clk" is received to the input terminals CLK of the static type latch circuits 80-1 to 80-3. When the pulse "clk" received from the input terminals CLK is "H" level in the static type latch circuits 80-1 to 80-3, the trimming information "data" is received from each of the input terminals DATA and is transmitted to each of the output terminals OUT, resulting in generation of the output signals "Lda1", "Lda2", and "Lda3".

If the pulse "latchd" is "H" level, the output pulse OR gate 73 "clk" is also "H" level. A logic of the trimming information "data" passing through the static type latch circuits 80-1 to 80-3 are generated as output signals "Lda1" to "Lda3" which is same logical as that of the trimming information "data". The detection signal "LdaNG" generated from the EXNOR gate 71 changes to "H" level, and the pulse "clkx" generated from the inverter 72 changes to "L" level through the delayed-pulse generation circuit 50-2. When the output pulse "clk" from the OR gate 73 changes from "H" level to "L" level after the pulse "clkx" changes to "L" level, logics of the signals "Lda1" to "Lda3" of latch circuits 80-1 to 80-3 are fixed. The majority logic of the outgoing signals "Lda1" to "Lda3" is obtained by the majority logic circuit 90 and the trimming output information "trmout" for the power output is generated.

By the above-mentioned operation, the trimming information "data" which determines an unblown or a blown states of the fuse element is held in four latch circuits which are the fuse latch circuit 30 and the static type latch circuits 80-1-80-3.

When one of the trimming information "data" held in the static type latch circuit 80-1-80-3 causes an error, the detection signal "LdaNG" generated from the EXNOR gate 71 inverses from "H" level to "L" level, and the output pulse "clkx" generated from inverter 72 keeps "H" level for a certain period via the delayed-pulse generation circuit 50-2. And then, the output pulse "clk" from the OR gate 73 keeps "H" level for a certain period, and trimming information "data" preserved in the fuse latch circuit 30 is held again in the static type latch circuits 80-1-80-3 and the error of the trimming information "data" is corrected.

When trimming information "data" preserved in the fuse latch circuit 30 causes an error, the detecting signal "trmNG" changes from "L" level to "H" level because a logical product between the trimming output information "trmout" and the trimming information "data" causes a difference. The error-detecting signal "Relatch" generated from the NAND gate 102 changes from "H" level to "L" level because the pulse "pd" generated from the fuse latch timing circuit 10A in a stationary state is "H" level. Then, the input pulse "latch"generated from the AND gate 110 keeps "L" level for a certain period in a similar way that the input potential "PDIN" changes from "H" level to "L" level because the error correction pulse "Ecc0" generated from the delayed-pulse generation circuit 50-1 keeps "L" level for a certain period. As a result, the fuse latch circuit distinguishes between cut or not cut state of the fuse element 35-2 again. The trimming information "data" is preserved again in the four latch circuits which are the fuse latch circuit 30 and the static type latch circuits 80-1 to 80-3, and the error is corrected.

The third embodiment of the present invention has effects similar to the first and second embodiments and, in addition, has an effect like the following:

According to the third embodiment of the present invention, three static type latch circuits 80-1 to 80-3 are provided in the ECC circuit 70. The trimming information "data" representing a blown state or an un-blown state of fuse element 35-2 is retained in four latch circuits of the fuse latch circuit 30 and the static type latch circuits 80-1 to 80-3. When one of the trimming information "data" retained in the static type latch circuits 80-1 to 80-3 causes an error, the error is self-corrected.

When the trimming information "data" retained in the fuse latch circuit 30 causes an error, the trimming information "data" representing a blown state or an un-blown state of fuse element 35-2 is determined again and the error is self-corrected. The fuse trimming circuit according to the third embodiment of the present invention can operate for a long time and can be applied to a LSI etc. which is usable under bad conditions and sensitive to static electricity and a soft error.

The present invention may not be limited to the first to third embodiments shown in the figures. The fuse latch timing circuits 10 and 10A, the bias circuit 20, fuse latch circuit 30, the POR circuit 40, the delayed-pulse generation circuits 50, 50-1, and 50-2, the gate circuit 60, the ECC circuit 70, and the error-detecting circuit 100 etc. may be replaced by ,for example, transistors and circuits different from the embodiments of the present invention shown in figures.

This application is based on Japanese Patent Application No. 2005-274368 which is hereby incorporated by reference.

What is claimed is:

1. A fuse trimming circuit comprising:
 a controlling circuit generating a first pulse which is generated by delaying an input pulse, a second pulse which is generated by delaying said first pulse, and a third pulse having a pulse width from a leading edge of said first pulse to a trailing edge which is generated by a trailing edge of said second pulse;
 a bias circuit connected across a first power supply node and a second power supply node, for generating a bias voltage during a time period of said pulse width in response to said third pulse;
 a fuse-state determining circuit having a first transistor, a first output node, a second transistor, and a resistive element which are connected in series between said first power supply node and said second power supply node, and said fuse-sate determining circuit having a third transistor, a second output node, a forth transistor, and a fuse element which are connected in series across said first power supply node and said second supply node, said first and third transistors turning on in response to said first pulse, said second and said fourth transistors turning on in response to said bias voltage, a resistance of said resistive element being larger than that of said fuse element in an un-blown state and smaller than that of said fuse element in a blown state; and
 a latch circuit connected across the said first power supply node and said second power supply node, for amplifying a voltage difference across said first and said second output nodes, for holding said voltage difference as trimming information which represents a blown state or an un-blown state of said fuse element.

2. A fuse trimming circuit according to claim 1, further comprising:
 a first capacitor connected in parallel between said first transistor and said first output node which is activated by an inverted pulse which inverts said first pulse;
 a second capacitor connected in parallel between said first output node and said second transistor which is induced when a voltage at said second output node changes to a high level;
 a third capacitor connected in parallel between said third transistor and said second node which is induced by said inverted pulse; and
 a fourth capacitor connected in parallel between said second output node and said fourth transistor which is induced when a voltage at said first output node changes to a high level.

3. A fuse trimming circuit according to claim 1, further comprising:
 a reset circuit connected across said first power supply node and said second power supply node, for generating a reset signal until a power supply voltage applied to said first and second power supply nodes reaches a voltage at which the said latch circuit can latch when said power supply voltage is turned on;
 a pulse generating circuit which receives an input pulse having a logical level and generates a fourth pulse having a pulse width in response to a change of said logical level of said input pulse; and
 a gate circuit which obtains a logical product of said reset signal and said fourth pulse and generates said input pulse corresponding to said logical product to said controlling circuit.

4. A fuse trimming circuit according to claim 1, further comprising:
 a reset circuit connected across said first power supply node and said second power supply node, for generating a reset signal until a power supply voltage applied to said first and said second power supply nodes reaches a voltage at which the said latch circuit can latch when said power supply voltage is turned on;
 an error-correcting circuit which holds said trimming information retained in said latch circuit on the basis of a fifth pulse which inverts said third pulse generated from said controlling circuit and holds said trimming information as trimming output information, said error-correcting circuit which latches again said trimming information retained in said latch circuit on the basis of said fifth pulse which inverts said third pulse generated from said controlling circuit again and corrects an error causing in said trimming output information when said error causing in said trimming output information is detected;
 an error-detecting circuit which compares said trim information retained in said latch circuit with said trimming output information retained in said error-correcting circuit, detects a presence of an error in said trimming information, and generates an error-detecting signal on the basis of said third pulse when detecting an error in said trimming information;
 a first pulse generating circuit generating a fourth pulse having a pulse width in response to an input signal received therein having a logical level and in response to a change of said logical level of said input signal;
 a second pulse generating circuit which generates an error-correcting pulse having a pulse width in response to said error-detecting signal; and a gate circuit obtaining a logical product on said reset signal and said error-correcting pulse and generating said input pulse corresponding to said logical product to said controlling circuit of said fuse trimming circuit.

5. A fuse trimming circuit according to claim 4, further comprising:
  plural latch means, each of said plural latch means to latch said trimming information retained in said latch circuit on the basis of a fifth pulse that inverts said the third pulse generated from said controlling circuit;
  a majority logical means to obtain a majority logic product on plural said trimming information retained in said plural latch means and generate a trimming out information;
  an error-detecting means to compare said plural trimming information retained in said plural latch means and detect errors causing in said plural trimming information; and
  an error-correcting means to cause said trimming information retained in said latch circuit to be held in said plural latch means on the basis of said fifth pulse generated from said controlling circuit when said error-detecting means detects errors causing in said plural trim information and to correct errors causing in said trimming out information.

6. A fuse trimming circuit according to one of claims 2 to 5, wherein said first, said second, said third, and said fourth transistors are MOS transistors, respectively and said first, said second, said third, and said fourth capacitors are MOS capacitors, respectively.

7. A fuse trimming circuit comprising:
  a first node to which a first voltage is supplied;
  a second node to which a second voltage lower than said first voltage is supplied;
  a controlling circuit delaying a input signal and generating an output signal;
  a bias circuit connected to said first and said second nodes generating a bias voltage;
  a first transistor provided between said first and a third nodes conducting between said first and said third nodes by said output signal generated from said controlling circuit;
  a second transistor provided between said third and a fourth nodes conducting between said third and said fourth nodes by said output signal generated from said controlling circuit;
  a fuse element provided between said fourth and said second nodes; and
  a latch circuit provided between said third node and a output node holding an electrical potential supplied from said bias voltage.

* * * * *